(12) United States Patent
Yoon

(10) Patent No.: US 7,821,846 B2
(45) Date of Patent: Oct. 26, 2010

(54) SEMICONDUCTOR MEMORY DEVICE AND ITS DRIVING METHOD

(75) Inventor: Seok-Cheol Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 79 days.

(21) Appl. No.: 12/240,459

(22) Filed: Sep. 29, 2008

(65) Prior Publication Data

US 2009/0086552 A1 Apr. 2, 2009

(30) Foreign Application Priority Data

Sep. 28, 2007 (KR) .................. 10-2007-0098222
Sep. 25, 2008 (KR) .................. 10-2008-0093933

(51) Int. Cl.
*G11C 7/10* (2006.01)
(52) U.S. Cl. .................. 365/189.05; 365/189.12
(58) Field of Classification Search .......... 365/189.05, 365/189.12, 230.08; 711/154
See application file for complete search history.

(56) References Cited

U.S. PATENT DOCUMENTS

| | | | | |
|---|---|---|---|---|
| 5,905,690 A | * | 5/1999 | Sakurai et al. | ........... 365/233.1 |
| 5,973,988 A | * | 10/1999 | Nakahira et al. | ......... 365/49.17 |
| 6,693,832 B2 | | 2/2004 | Ok | |
| 7,102,958 B2 | | 9/2006 | Lee et al. | |
| 7,304,906 B2 | | 12/2007 | Ha et al. | |
| 2007/0088921 A1 | * | 4/2007 | Kim et al. | .................. 711/154 |
| 2007/0147148 A1 | * | 6/2007 | An | .............. 365/201 |
| 2007/0180202 A1 | * | 8/2007 | Kawabata et al. | ........... 711/154 |
| 2008/0002804 A1 | | 1/2008 | Jeong | |

FOREIGN PATENT DOCUMENTS

| | | |
|---|---|---|
| JP | 2000-030464 | 1/2000 |
| JP | 2005-322251 | 11/2005 |
| KR | 1020040034168 A | 4/2004 |

OTHER PUBLICATIONS

Notice of Allowance issued from Korean Intellectual Property Office on Jan. 28, 2010.

* cited by examiner

*Primary Examiner*—Vu A Le
(74) *Attorney, Agent, or Firm*—IP & T Law Firm PLC

(57) ABSTRACT

A semiconductor memory device including a first latch that latches a Mode Register Set (MRS) code consisting of multiple bits in response to an MRS command pulse, a code controller that generates a control signal in response to a code value of preset bits out of an output signal from the first latch, a second latch that selectively latches the output signal from the first latch in response to the control signal and a mode decoder that decodes an output signal from the second latch to output an operation mode.

19 Claims, 3 Drawing Sheets

SEMICONDUCTOR MEMORY DEVICE AND ITS DRIVING METHOD

CROSS-REFERENCE TO RELATED APPLICATIONS

The present invention claims priority of Korean patent application numbers 10-2007-0098222 and 10-2008-0093933, filed on Sep. 28, 2007 and Sep. 25, 2008, respectively, which are incorporated by reference in its entirety.

BACKGROUND OF THE INVENTION

The present invention relates to a semiconductor design technology, particularly to a semiconductor memory design technology, and more particularly to a technology of processing a Mode Register Set (MRS) command to determine an operation mode of Dynamic Random Access Memory (DRAM).

In general, most semiconductor memory devices, including DRAMs, should determine an operation mode, such as a Column Address Strobe (CAS) Latency (CL), a Burst Length (BL), a Burst Type (BT) or the like, which meets characteristics required for a system. When an MRS command is inputted, the operation mode is determined based on an MRS code applied to an address pin.

The MRS code consists of a combination of address of 1 bit or multiple bits. For example, an address A0-A2 is used to determine a burst length BL2, BL4, or BL8, an address A3 is used to determine a burst type (sequential or interleave), and an address A4-A6 is used to determine a CAS latency CL1.5, CL2, CL2.5, or CL3. In addition, an address A7 is used to determine whether a memory device is in a test mode or a normal mode, and an address A8 is used to determine whether to reset a Delay Locked Loop (DLL).

Once a mode register field is determined, information thereon is kept until it is reset by another MRS command.

FIG. 1 is a block diagram of a general MRS decoder.

Referring to FIG. 1, the general MRS decoder includes a mode register 10 for latching an MRS code ADD<0:16> in response to an MRS command pulse MRSP, and a mode decoder 12 for decoding a latched MRS code MREG<0:16> to determine an operation mode.

To be more specific, when an MRS code ADD<0:16> is inputted via an address pin together with an MRS command, the mode register 10 latches the MRS code ADD<0:16> in synchronism with an MRS command pulse MRSP generated, in response to the MRS command.

The mode decoder 12 then decodes a latched MRS code MREG<0:16> to output an operation mode signal, such as CL, BL, BT, or the like.

In the above-described general MRS decoder, however, when an illegal MRS code is inputted, a semiconductor memory device is malfunctioning. That is to say, the general MRS decoder decodes such an illegal code as it is upon receipt thereof, and thus causes the memory device to operate in an erroneous operation mode.

SUMMARY OF THE INVENTION

Embodiments of the present invention are directed to providing a semiconductor memory device capable of preventing a malfunction that may occur when an illegal MRS code is applied thereto, and its driving method.

In accordance with an aspect to the invention, there is provide a semiconductor memory device comprising a first latch for latching a Mode Register Set (MRS) code consisting of multiple bits in response to an MRS command pulse, a code controller for generating a control signal in response to a code value of preset bits out of an output signal from the first latch, a second latch for selectively latching the output signal from the first latch in response to the control signal and a mode decoder for decoding an output signal from the second latch to output an operation mode.

In accordance with another aspect to the invention, there is provide a driving method of a semiconductor memory device comprising judging whether a Mode Register Set (MRS) code is illegal or not based on a code value of predetermined bits out of the MRS code of multiple bits when the MRS code is applied and determining an operation mode based on a previous MRS code value when the MRS code is judged to be an illegal code in the judging step.

The invention prevents a malfunction by making all MRS codes, as well as an MRS code consisting of a combination of address of multiple bits and corresponding to a specific operation mode (e.g., CL), kept at a previous state when the MRS code applied is illegal.

DESCRIPTION OF SPECIFIC EMBODIMENTS

Hereinafter, a preferred embodiment in accordance with the present invention will be described in detail with reference to the accompanying drawings so that the invention can readily be practiced by those skilled in the art to which the invention pertains.

Figure 1:
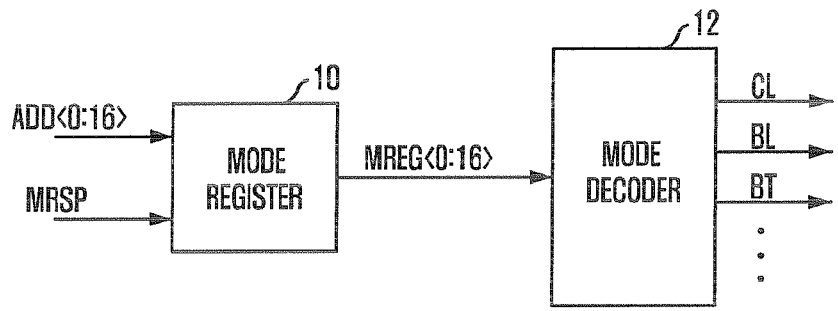
FIG. 1 is a block diagram of a general MRS decoder.
Figure 2:
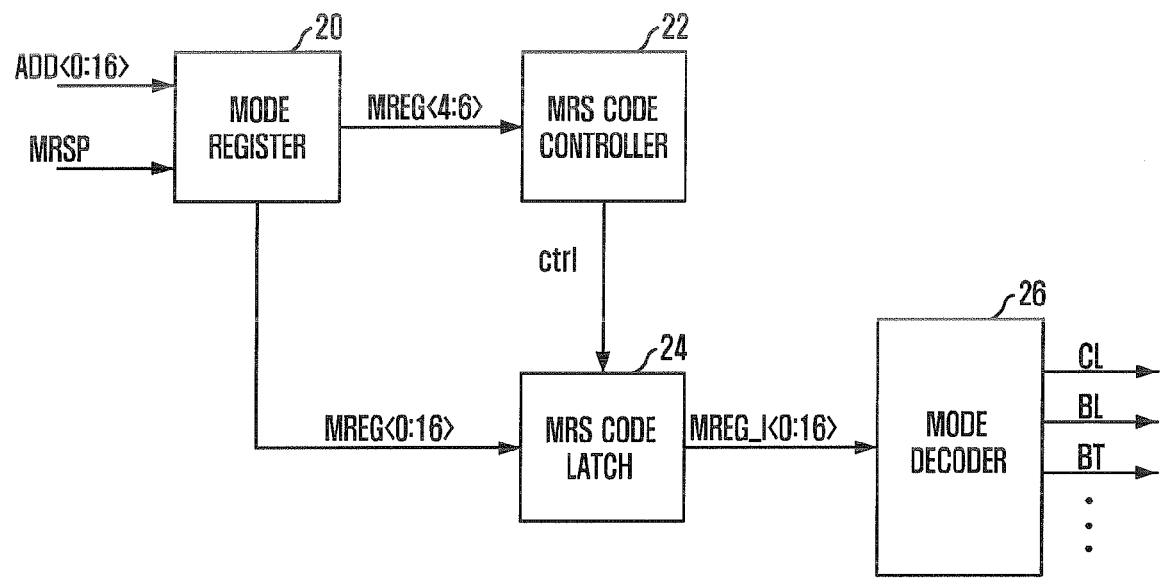
FIG. 2 is a block diagram of an MRS decoder in accordance with one embodiment of the present invention.

FIG. 2 is a block diagram of an MRS decoder in accordance with one embodiment of the invention.

Referring to FIG. 2, the MRS decoder in accordance with this embodiment includes a mode register 20 for latching an MRS code ADD<0:16> in response to an MRS command pulse MRSP, an MRS code controller 22 for accepting a latched MRS code MREG<4:6> corresponding to a specific operation mode (e.g., CL) to generate a control signal CTRL, an MRS code latch 24 for selectively latching the latched MRS code MREG<0:16> in response to the control signal CTRL, and a mode decoder 26 for decoding a final MRS code MREG_I<0:16> outputted from the MRS code latch 24 to output an operation mode.

Figure 3:
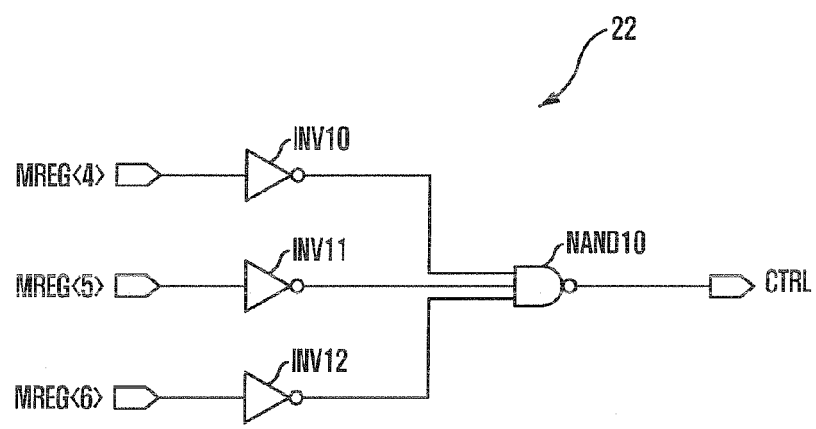
FIG. 3 is a circuit diagram illustrating a first logic implementation of the MRS code controller 22 in FIG. 2.

FIG. 3 is a circuit diagram illustrating a first logic implementation of the MRS code controller 22 depicted in FIG. 2.

Referring to FIG. 3, the MRS code controller 22 is provided with inverters INV10, INV11, and INV12 that invert latched MRS codes MREG<4>, MREG<5>, and MREG<6>, respectively, and a NAND gate NAND10 for performing a NAND operation on output signals from the inverters INV10, INV11, and INV12 to output a control signal CTRL.

Figure 4:
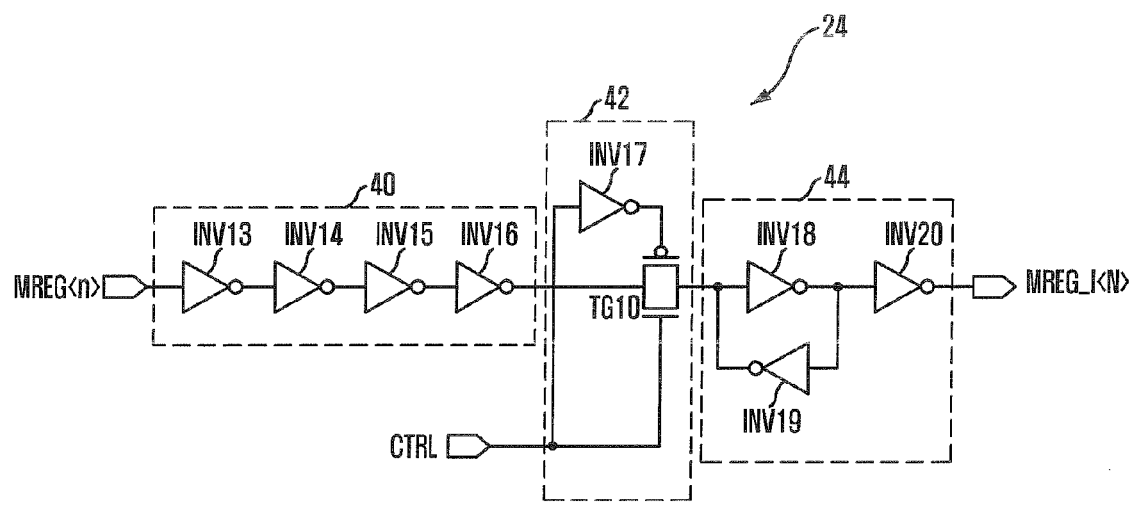
FIG. 4 is a circuit diagram illustrating a logic implementation of the MRS code latch 24 in FIG. 2.

FIG. 4 is a circuit diagram illustrating a logic implementation of the MRS code latch 24 in FIG. 2.

Referring to FIG. 4, the MRS code latch 24 is provided with a buffer 40 for buffering an MRS code MREG<N> outputted from the mode register 20, a transfer unit 42 for selectively transferring an output signal from the buffer 40 to a next stage in response to the control signal CTRL, and a latch 44 for latching an output signal from the transfer unit 42.

The circuit shown in FIG. 4 is configured to correspond to a bit N out of plural MRS code latches in the MRS code latch 24, wherein the MRS code latches may be composed to have the number of code bits.

Here, the buffer 40 is provided with an inverter INV13 for inverting an MRS code MREG<N>, an inverter INV14 for inverting an output signal from the inverter INV13, an inverter INV15 for inverting an output signal from the inverter INV14, and an inverter INV16 for inverting an output signal from the inverter INV15.

The transfer unit 42 is provided with an inverter INV17 for inverting the control signal CTRL, and a transmission gate TG10 for switching an output signal from the buffer 40 under the control of both the control signal CTRL and an output signal from the inverter INV17.

The latch 44 is provided with an inversion latch INV18 and INV19 for inversion-latching an output signal from the transfer circuit 42, and an inverter INV20 for inverting an output signal from the inversion latch INV18 and INV19 to output a final MRS code MREG_I<N>.

In operation, when the MRS code ADD<0:16> is inputted via an address pin together with the MRS command, the mode register 20 latches the MRS code ADD<0:16> in synchronism with the MRS command pulse MRSP generated in response to the MRS command.

The MRS code controller 22 then generates the control signal CTRL based on the latched MRS code MREG<4:6> applied thereto. The control signal CTRL becomes a logic low level when the latched MRS codes MREG<4>, MREG<5>, and MREG<6> are all '0', and becomes a logic high level otherwise. The latched MRS codes MREG<4>, MREG<5>, and MREG<6> are the ones to determine a CAS latency CL. When these latched MRS codes MREG<4>, MREG<5>, and MREG<6> are all '0', they are considered undefined illegal codes.

When the latched MRS code MREG<4:6> is a normal one, the control signal CTRL is at a logic high level. Therefore, the transmission gate TG10 in the MRS code latch 24 is turned on, and thus outputs the latched MRS code MREG<0:16> as it is as a final MRS code MREG_I<0:16>.

On the other hand, when an illegal code is applied, that is, when the control signal CTRL is at a logic low level, the transmission gate TG10 in the MRS code latch 24 is turned on. In this case, the latched MRS code MREG<0:16> does not pass through the transmission gate TG10, but a previous code already latched by the latch 44 is outputted as a final MRS code MREG_I<0:16>.

Thereafter, the mode decoder 26 decodes the final MRS code MREG<0:16> from the MRS code latch 24 to output an operation mode signal such as CL, BL, BT, or the like.

In accordance with the embodiment set forth above, the MRS code MREG<0:16> latched by the MRS command pulse MRSP is not used as it is, but used as follows. That is, only when a normal MRS code MREG<0:16>, which is a combination of specific codes, is applied, the latched MRS code MREG<0:16> is outputted as the final MRS code MREG_I<0:16> and then decoded. However, when an abnormal MRS code MREG<0:16>, which is a combination of specific codes, is applied, the MRS code MREG<0:16> is not outputted as the final MRS code MREG_I<0:16> but its previous MRS code is kept. In other words, when an illegal MRS code is inputted, its previous MRS code (e.g., a default MRS code at the time of initial operation) is kept, thus making the operation mode unchanged.

Figure 5:
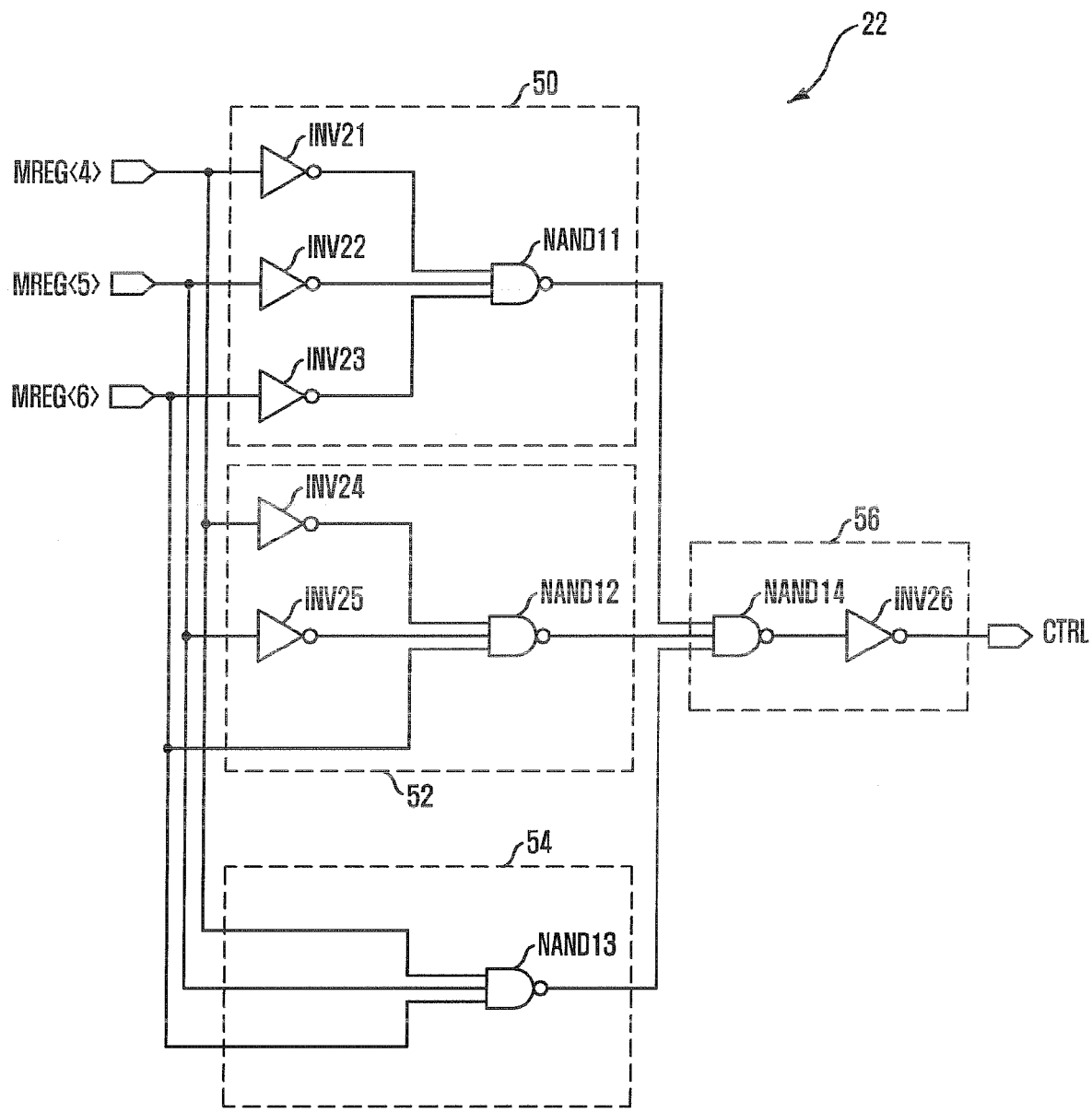
FIG. 5 is a circuit diagram illustrating a second logic implementation of the MRS code controller 22 depicted in FIG. 2.

FIG. 5 is a circuit diagram illustrating a second logic implementation of the MRS code controller 22 shown in FIG. 2.

Referring to FIG. 5, the MRS code controller 22 is provided with first to third illegal code detectors 50, 52, and 54 for accepting latched MRS codes MREG<4>, MREG<5>, and MREG<6> to detect predetermined combinations of illegal codes, respectively, and a combining unit 56 for combining output signals from the first to third illegal code detectors 50, 52, and 54 to output a control signal CTRL.

More specifically, the first illegal code detector 50 is composed of inverters INV21, INV22, and INV23 for inverting the latched MRS codes MREG<4>, MREG<5>, and MREG<6>, respectively, and a NAND gate NAND11 for performing a NAND operation on output signals from the inverters INV21, INV22, and INV23.

The second illegal code detector 52 is composed of inverters INV24 and INV25 for inverting the latched MRS codes MREG<4> and MREG<5>, respectively, and a NAND gate NAND12 for carrying out a NAND operation on output signals from the inverters INV24 and INV25 and the MRS code MREG<6>.

The third illegal code detector 54 is composed of a NAND gate NAND11 for performing a NAND operation on the latched MRS codes MREG<4>, MREG<5>, and MREG<6>.

The combining unit 56 is composed of a NAND gate NAND14 for performing a NAND operation on output signals from the first to third illegal code detectors 50, 52 and 54, and an inverter INV26 for inverting an output signal from the NAND gate NAND14 to output the control signal CTRL.

In a comparison between the first logic implementation of the MRS code controller 22 in FIG. 3 and the second logic implementation in FIG. 5, the first logic implementation can detect only a case where the latched MRS codes MREG<4>, MREG<5>, and MREG<6> are '000', while the second logic implementation can detect all illegal cases, including a case where the latched MRS codes MREG<4>, MREG<5>, and MREG<6> are '000', as well as a case where they are '001' or '111'. That is, the first illegal code detector 50 can detect an illegal code '000', the second illegal code detector 52 can detect an illegal code '001', and the third illegal code detector 54 can detect an illegal code '111'.

While the invention has been described with respect to the particular embodiment that determines an illegal code by detecting whether an MRS code corresponding to a CAS latency CL is illegal or not, it may also be applied to a case of determining an illegal code by detecting whether an MRS code corresponding to another operation mode consisting of a combination of address of more than 2 bits like a burst length BL is illegal or not. For reference, in case of an operation mode consisting of a combination of address of 1 bit (e.g., burst type BT), since there is no illegal code, it cannot be adopted as a reference for determination whether an MRS code is illegal or not.

It should be noted that the logic gates used in the embodiment set forth above may be replaced by other gates based on active polarity of related signals.

As described above, the invention can prevent a semiconductor memory device from erroneously operating due to an illegal MRS code, thereby securing a stable operation of the memory device.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a first latch configured to latch a Mode Register Set (MRS) code having multiple bits in response to an MRS command pulse;
   a code controller configured to generate a control signal in response to a code value of preset bits among the multiple bits of the MRS code output from the first latch;
   a second latch configured to selectively latch the MRS code having multiple bits output from the first latch in response to the control signal; and
   a mode decoder configured to decode an output signal from the second latch to output an operation mode.

2. The semiconductor memory device as recited in claim 1, wherein the MRS code having multiple bits is inputted via a plurality of address pins when the MRS command pulse is applied.

3. The semiconductor memory device as recited in claim 2, wherein the second latch includes a plurality of bit latches corresponding to a number of bits of the MRS code from the first latch.

4. The semiconductor memory device as recited in claim 3, wherein each of the plurality of bit latches includes
   a buffer configured to buffer corresponding bits of the MRS code outputted from the first latch,
   a transfer unit configured to selectively transfer an output signal from the buffer in response to the control signal, and
   a latch configured to latch an output signal from the transfer unit.

5. The semiconductor memory device as recited in claim 2, wherein the code controller includes
   a first illegal code detector configured to receive first and second bits of the MRS code outputted from the first latch to detect a predetermined illegal code combination,
   a second illegal code detector configured to take the first and the second bits to detect a predetermined illegal code combination other than that detected by the first illegal code detector, and
   a combining unit configured to combine output signals from the first and the second illegal code detectors to output the control signal.

6. The semiconductor memory device as recited in claim 2, wherein the code controller generates the control signal in response to bits of the MRS code that correspond to a Column Address Strobe (CAS) latency.

7. The semiconductor memory device as recited in claim 6, further comprising:
   a first illegal code detector configured to accept first to third bits of the MRS code outputted from the first latch to detect a predetermined illegal code combination;
   a second illegal code detector configured to take the first and the second bits of the MRS code outputted from the first latch to detect a predetermined illegal code combination other than that detected by the first illegal code detector;
   a third illegal code detector configured to receive the first and the second bits to detect a predetermined illegal code combination other than those detected by the first and the second illegal code detectors; and
   a combining unit configured to combine output signals from the first to third illegal code detectors to output the control signal.

8. The semiconductor memory device as recited in claim 7, wherein the first illegal code detector includes first to third inverters configured to invert the first to third bits of the MRS code outputted from the first latch, respectively, and a first NAND gate configured to perform a NAND operation on output signals from the first to third inverters.

9. The semiconductor memory device as recited in claim 8, wherein the second illegal code detector includes fourth and fifth inverters configured to invert the first and the second bits of the MRS code outputted from the first latch, respectively, and a second NAND gate configured to perform a NAND operation on output signals from the fourth and the fifth inverters and the third bit of the MRS code.

10. The semiconductor memory device as recited in claim 9, further comprising:
    a third NAND gate configured to perform a NAND operation on the first to third bits of the MRS code outputted from the first latch.

11. The semiconductor memory device as recited in claim 10, wherein the combining unit includes a fourth NAND gate configured to perform a NAND operation on output signals from the first to third illegal code detectors, and a sixth inverter configured to invert an output signal from the fourth NAND gate to output the control signal.

12. The semiconductor memory device as recited in claim 4, wherein the buffer includes an inverter chain configured to invert the corresponding bits of the MRS code outputted from the first latch.

13. The semiconductor memory device as recited in claim 12, wherein the transfer unit includes a transmission gate configured to switch an output signal from the buffer in response to the control signal and its inverted signal.

14. The semiconductor memory device as recited in claim 13, wherein the latch includes an inversion latch configured to latch an output signal from the transfer unit, and an inverter configured to invert an output signal from the inversion latch.

15. A method of a driving semiconductor memory device comprising:
    judging whether a Mode Register Set (MRS) code is illegal or not based on a code value of predetermined bits among multiple bits of the MRS code when the MRS code is applied, and
    determining an operation mode based on a previous MRS code value when the MRS code is judged to be an illegal code by said judging.

16. The driving method as recited in claim 15, further comprising determining an operation mode based on the MRS code value when the MRS code is judged to be an illegal code by said judging.

17. The semiconductor memory device as recited in claim 1, wherein the control signal includes information about whether the MRS code is illegal or not.

18. The semiconductor memory device as recited in claim 1, wherein the preset bits among the multiple bits of the MRS code is a subset of the multiple bits of the MRS code.

19. The method as recited in claim 15, wherein the predetermined bits among the multiple bits of the MRS code is a subset of the multiple bits of the MRS code.

* * * * *